US006985695B1

(12) United States Patent
Kato

(10) Patent No.: US 6,985,695 B1
(45) Date of Patent: Jan. 10, 2006

(54) SATELLITE BROADCASTING RECEIVER RECEIVING SIGNAL RADIO WAVES TWO BROADCASTING SATELLITES

(75) Inventor: Masahiro Kato, Nagaokakyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/496,038

(22) Filed: Feb. 1, 2000

(30) Foreign Application Priority Data

Feb. 3, 1999 (JP) ................................. 11-025820
Oct. 22, 1999 (JP) ................................. 11-301168

(51) Int. Cl.
 *H04H 1/00* (2006.01)
(52) U.S. Cl. ................... 455/3.02; 455/12.1; 455/13.1; 455/502; 455/503
(58) Field of Classification Search ............... 455/3.02, 455/11.1, 12.1, 13.1, 502, 503; 370/315, 370/316, 324
See application file for complete search history.

(56) References Cited

U.S. PATENT DOCUMENTS

| | | | | |
|---|---|---|---|---|
| 4,535,476 A | * | 8/1985 | Carlin | ........................ 455/63.1 |
| 4,847,862 A | * | 7/1989 | Braisted et al. | ............. 375/376 |
| 5,068,918 A | * | 11/1991 | Verheijen et al. | ........... 455/12.1 |
| 5,369,780 A | * | 11/1994 | Jung | ........................... 455/12.1 |
| 6,144,259 A | * | 11/2000 | Kirisawa | ..................... 330/296 |
| 6,418,304 B1 | * | 7/2002 | Morrar | ..................... 455/343.1 |
| 6,496,682 B2 | * | 12/2002 | Butte et al. | ................. 455/12.1 |
| 6,597,670 B1 | * | 7/2003 | Tweedy et al. | ............. 370/328 |

FOREIGN PATENT DOCUMENTS

JP        10-173562        6/1998

* cited by examiner

*Primary Examiner*—Temica Beamer
(74) *Attorney, Agent, or Firm*—Nixon & Vanderhye P.C.

(57) ABSTRACT

A satellite broadcasting receiver (LNB) receiving signal radio waves from broadcasting satellites is provided with a low noise amplifier (LNA) amplifying a received signal, and a frequency converting circuit converting an output from the LNA to an intermediate frequency signal for output. The LNA includes four amplifiers in the first stage respectively amplifying four types of different received signals. A power supply control circuit sets a current flowing through one of four amplifiers at a prescribed value and sets currents flowing through all the other amplifiers at 0. Thus, the output from only one amplifier is supplied to the amplifier in the second stage for amplification and further applied to the frequency converting circuit. Accordingly, the amplifiers in the first stage do not simultaneously consume currents, and a switching circuit is not necessary.

29 Claims, 10 Drawing Sheets

FIG.3

| PULSE | VOLTAGE | INPUT 1 | INPUT 2 | INPUT 3 | INPUT 4 |
|---|---|---|---|---|---|
| YES | High | OUTPUT | × | × | × |
| YES | Low | × | OUTPUT | × | × |
| NO | High | × | × | OUTPUT | × |
| NO | Low | × | × | × | OUTPUT |

SATELLITE BROADCASTING RECEIVER RECEIVING SIGNAL RADIO WAVES TWO BROADCASTING SATELLITES

BACKGROUND OF THE INVENTION

1. Field of the Invention

The present invention relates to satellite broadcasting receivers and, more specifically to a satellite broadcasting receiver capable of switching and receiving signal radio waves from two broadcasting satellites.

2. Description of the Background Art

A conventional receiving equipment for satellite broadcasting basically includes: a reflection plate (reflection mirror) called a dish for receiving a signal radio wave transmitted from a broadcasting satellite in a geostationary orbit; a satellite broadcasting receiver receiving the signal radio wave reflected by the dish through a waveguide and performing low noise amplification on the received signal radio wave of 12 GHz band and then converting it to an intermediate frequency signal of 1 GHz to 2 GHz for output; and a tuner unit selecting and demodulating a desired signal band from the intermediate frequency signal supplied from the satellite broadcasting receiver through a signal cable. Generally, the satellite broadcasting receiver is fixed to the dish by means of a supporting arm, and the dish, the satellite broadcasting receiver and the supporting arm constitute an antenna system (so called a parabolic antenna). The antenna system is provided outdoors, and electric power and a control signal are supplied to the satellite broadcasting receiver through the signal cable from the tuner unit provided indoors.

Like the above described satellite broadcasting receiver, the apparatus having a function of low noise amplification and a function of conversion to an intermediate frequency is generally referred to as a low noise block down converter (LNB). Thus, in the following, such a satellite broadcasting receiver (excluding the waveguide portion) is simply referred to as an LNB.

Recently, a satellite broadcasting receiving system has been developed which can receive broadcasting signals from two broadcasting satellites in a geostationary orbit. FIG. 13 is a schematic block diagram showing two LNBs and a waveguide forming such a satellite broadcasting receiving system (not showing a tuner unit).

Referring to FIG. 13, an LNB 100 is provided to receive a broadcasting signal from one broadcasting satellite, and an LNB 200 is provided to receive a broadcasting signal from the other broadcasting satellite. LNBs 100 and 200 have identical structures. A waveguide for LNB 100 and a waveguide for LNB 200 are integrally formed as a waveguide 300.

As LNBs 100 and 200 have identical structures, only the structure of LNB 100 will be described.

Provided inside waveguide 300 for LNB 100 are probes (not shown) for detecting a horizontal polarization component H and a vertical polarization component V from a signal radio wave received from a corresponding broadcasting satellite.

Horizontal and vertical polarization components H and V detected by the probes (not shown) are supplied to a low noise amplifier (LNA) 100a of LNB 100. LNA 100a switches and selects signals obtained by amplifying horizontal and vertical polarization components H and V of the signal radio wave received from the corresponding broadcasting satellite, and further amplifies and supplies it to a band pass filter (BPF) 10b. The switching of the horizontal and vertical polarization components by LNA 100a is controlled by a power supply control circuit 10d.

BPF 100b passes a signal at 12 GHz band, which falls within a receiving band for satellite broadcasting, and more specifically at a frequency band from 12.2 GHz to 12.75 GHz, and applies it to a microwave monolithic integrated circuit (MMIC) 100c.

MMIC 100c functions as a mixing circuit mixing a local oscillator signal of 11.2 GHz output form an oscillator 100e and an output from BPF 100b, and converts the signal in the range from 12.2 GHz to 12.75 GHz output from BPF 100b to an intermediate frequency signal in the range from 1000 MHz to 1550 MHz. More specifically, MMIC 100c and oscillator 100e form a frequency converting circuit. It is noted that an operation current is supplied from power supply control circuit 100d to MMIC 100c and oscillator 100e.

The intermediate frequency signal obtained by the frequency conversion of MMIC 100c is applied to a terminal 100f through a capacitor C, and then transmitted to a tuner unit (not shown) provided indoors through a signal cable (not shown). It is noted that the operation of power supply control circuit 100d is controlled by a control signal supplied from the above mentioned tuner unit (not shown) through the signal cable, terminal 100f and an inductor L.

As described above, the other LNB 200 has the same structure as the above described LNB 100, and therefore the satellite broadcasting receiving system in FIG. 13 as a whole can receive four different types of signal radio waves in total, i.e., a horizontal or vertical component from one or the other broadcasting satellite.

However, in the conventional satellite broadcasting receiving system shown in FIG. 13, two signal cables are required for connection of two LNBs 100 and 200 to the tuner unit (not shown). An improved structure where only one signal cable is required is disclosed for example in Japanese Patent Laying-Open No. 10-173562.

In the improved structure (not shown), a satellite selecting switch switching and selecting outputs from LNA 100a of one LNB 100 and from LNA 200a of the other LNB 200 is provided. In addition, one system of a circuit structure (a BPF, MMIC, oscillator, capacitor, output terminal) is provided in the subsequent stage, which is required for frequency conversion or the like.

Then, an output from one LNA that has been selected by the satellite selecting switch is supplied to a frequency converting circuit of the above mentioned one system. Thus, an intermediate frequency signal obtained by converting the signal radio wave from one or the other broadcasting satellite by a common frequency converting circuit is output from one output terminal. Accordingly, only one signal cable is necessary for supplying a signal to the tuner unit.

However, such an improved satellite broadcasting receiving system still suffers from the following problem.

More specifically, referring to FIG. 13, LNA 100a of one LNB 100 includes two amplifiers respectively amplifying horizontal and vertical polarization components H and V from one broadcasting satellite. LNA 200a of the other LNB 200 also includes two amplifiers respectively amplifying horizontal and vertical polarization components H and V from the other broadcasting satellite. As these four amplifiers are always set in the operation state, power consumption is large and a power supply of the tuner unit for supplying electric power to these amplifiers is also large in size.

In addition, a horizontal/vertical selecting switch is required for switching outputs obtained by amplifying horizontal and vertical polarization components H and V for each of LNAs 100a and 200a. Further, to reduce the number of signal cables to one, as described above, a satellite selecting switch is also required. A plurality of elements for switching are required for these switches, so that the parts number of the whole system increases.

SUMMARY OF THE INVENTION

One object of the present invention is to provide a satellite broadcasting receiver operating with reduced power consumption.

Another object of the present invention is to provide a satellite broadcasting receiver with the reduced number of parts.

According to one aspect of the present invention, a satellite broadcasting receiver receiving a signal radio wave from a broadcasting satellite includes first to nth (where n is an integer equal to or larger than 2) amplifiers, a connection node, and a power supply control circuit. The first to nth amplifiers respectively amplify first to nth signals extracted from the signal radio wave. Outputs from the first to nth amplifiers are supplied to the connection node. The power supply control circuit controls the first to nth amplifiers to set a current flowing through one of the first to nth amplifiers at a prescribed value and set currents flowing through all the other amplifiers at 0 such that an output from the one amplifier is transmitted through the connection node.

Accordingly, all of the n amplifiers do not simultaneously consume electric power, and a reduction in power consumption is achieved. In addition, as the output from the amplifier can be selected without having to provide switching circuit, a reduction in the number of parts can be achieved.

According to another aspect of the present invention, a satellite broadcasting receiver receiving signal radio waves from the broadcasting satellites includes first to fourth amplifiers, first to third connection nodes, a fifth amplifier, and a power supply control circuit. The first to fourth amplifiers respectively amplify first to fourth signals extracted from the signal radio waves. Outputs from the first and second amplifiers are supplied to the first connection node. Outputs from the third and fourth amplifiers are supplied to the second connection node. Outputs from the first and second connection nodes are supplied to the third connection node. The fifth amplifier amplifies an output transmitted from the third connection node. The power supply control circuit controls the first to fourth amplifiers to set a current flowing through one of the first to fourth amplifiers at a prescribed value and set currents flowing through all the other amplifiers at 0 such that an output from the one amplifier is transmitted to the fifth amplifier through the third connection node.

According to still another aspect of the present invention, a satellite broadcasting receiver receiving signal radio waves from broadcasting satellites includes first to fourth amplifiers, first and second connection nodes, fifth and sixth amplifiers, a third connection node, and a power supply control circuit. The first to fourth amplifiers respectively amplify first to fourth signals extracted from the signal radio waves. Outputs from the first and second amplifiers are supplied to the first connection node. Outputs from the third and fourth amplifiers are supplied to the second connection node. The fifth amplifier amplifies an output transmitted from the first connection node. The sixth amplifier amplifies an output transmitted from the second connection node. Outputs from the fifth and sixth amplifiers are supplied to the third connection node. The power supply control circuit controls the first to fourth amplifiers to set a current flowing through one of the first to fourth amplifiers at a prescribed value and set currents flowing through all the other amplifiers at 0 such that an output from the one amplifier is transmitted to the fifth or sixth amplifier through the first or second connection node. The power supply control circuit controls the fifth and sixth amplifiers to set currents flowing through the fifth and sixth amplifier respectively at a prescribed value and 0 such that an output from the fifth amplifier is transmitted through the third connection node, and set currents flowing through the fifth and sixth amplifiers respectively at 0 and a prescribed value such that an output from the sixth amplifier is transmitted through the third connection node.

As a result, the received signal can be amplified in two stages without increasing power consumption and without having to provide a switching circuit.

According to still another aspect of the present invention, a satellite broadcasting receiving system receiving signal radio waves from broadcasting satellites includes first and second satellite broadcasting receivers, and a waveguide. Each of the first and second satellite broadcasting receivers includes first to fourth amplifiers, first to third connection nodes, a fifth amplifier, a power supply control circuit, and a frequency converting circuit. The first to fourth amplifiers respectively amplify first to fourth signals extracted from the signal radio waves. Outputs from the first and second amplifiers are supplied to the first connection node. Outputs from the third and fourth amplifiers are supplied to the second connection node. Outputs from the first and second connection nodes are supplied to the third connection node. The fifth amplifier amplifies an output transmitted from the third connection node. The power supply control circuit controls the first to fourth amplifiers to set a current flowing through one of the first to fourth amplifiers at a prescribed value and set currents flowing through all the other amplifiers at 0 such that an output from one amplifier is transmitted to the fifth amplifier through the third connection node. The frequency converting circuit converts an output from the fifth amplifier to an intermediate frequency signal. The waveguide is integrally formed and shared by the first and second satellite broadcasting receivers.

As one waveguide is shared, the structure is not complicated and each of the two satellite broadcasting receivers can independently receive a signal radio wave from an arbitrary broadcasting satellite.

According to still another aspect of the present invention, a satellite broadcasting receiving system receiving signal radio waves from broadcasting satellites includes first and second satellite broadcasting receivers, a power supply control circuit, first and second output terminals, a switching circuit, and a waveguide. Each of the first and second satellite broadcasting receivers includes first to fourth amplifiers, first to third connection nodes, a fifth amplifier, and a frequency converting circuit. The first to fourth amplifiers respectively amplify first to fourth signals extracted from the signal radio waves. Outputs from the first and second amplifiers are supplied to the first connection node. Outputs from the third and fourth amplifiers are supplied to the second connection node. Outputs from the first and second connection nodes are supplied to the third connection node. The fifth amplifier amplifies an output transmitted from the third connection node. The frequency converting circuit converts an output from the fifth amplifier to an intermediate frequency signal. The power supply control circuit controls the first to fourth amplifiers to set a current flowing through one of the first to fourth amplifiers at a prescribed value and sets currents flowing through all the other amplifiers at 0 such that an output from the one amplifier is transmitted to the fifth amplifier through the third connection node. The switching circuit is controlled by the power supply control circuit, and selectively switches outputs from the frequency converting circuits of the first and second satellite broadcasting receivers and applies said outputs to the first and second output terminals. The waveguide is integrally formed and shared by the first and second satellite broadcasting receivers.

As described above, outputs from two frequency converting circuits are switched and output to two output terminals, so that a correspondency between the received signals from two broadcasting satellites and two output terminals is arbitrarily changed. In addition, as the power supply control circuit for two satellite broadcasting receivers is integrally formed, a further reduction in the number of parts can be achieved.

According to still another aspect of the present invention, a satellite broadcasting receiving system receiving signal radio waves from broadcasting satellites includes first and second satellite broadcasting receivers, a power supply control circuit, first and second frequency converting circuits, a switching circuit, and a waveguide. Each of the first and second satellite broadcasting receivers includes first to fourth amplifiers, first to third connection nodes, and a fifth amplifier. The first to fourth amplifiers respectively amplify first to fourth signals extracted from the signal radio wave. Outputs from the first and second amplifiers are supplied to the first connection node. Outputs from the third and fourth amplifiers are supplied to the second connection node. Outputs from the first and second connection nodes are supplied to the third connection node. The fifth amplifier amplifies an output from the third connection node. The power supply control circuit controls the first to fourth amplifiers to set a current flowing through one of the first to fourth amplifiers at a prescribed value and set currents flowing through all the other amplifiers at 0 such that an output from the one amplifier is transmitted to the fifth amplifier through the third connection node. Each of the first and second frequency converting circuits converts an applied amplifier output to an intermediate frequency signal. The switching circuit is controlled by the power supply control circuit, and selectively switches outputs from the respective fifth amplifiers of the first and second satellite broadcasting receivers and applies the outputs to the first and second frequency converting circuits. The waveguide is integrally formed and shared by the first and second satellite broadcasting receivers.

As described above, by switching and outputting the outputs from two satellite broadcasting receivers to two frequency converting circuits, a correspondency between the received signals from two broadcasting satellites and two frequency converting circuits can arbitrarily be changed. In addition, as the power supply control circuit for two satellite broadcasting receivers is integrally formed, a further reduction in the number of parts can be achieved.

According to still another aspect of the present invention, a satellite broadcasting receiving system receiving signal radio waves from broadcasting satellites includes first and second satellite broadcasting receivers, a power supply control circuit, first and second frequency converting circuits, a switching circuit, and a waveguide. Each of the first and second satellite broadcasting receivers includes first to fourth amplifiers, first to third connection nodes, and a fifth amplifier. The first to fourth amplifiers respectively amplify first to fourth signals extracted from the signal radio waves. Outputs from the first and second amplifiers are supplied to the first connection node. Outputs from the third and fourth amplifiers are supplied to the second connection node. Outputs from the first and second connection nodes are supplied to the third connection node. The fifth amplifier amplifies an output from the third connection node. The power supply control circuit controls the first to fourth amplifiers to set a current flowing through one of the first to fourth amplifiers at a prescribed value and set currents flowing through all the other amplifiers at 0 such that an output from the one amplifier is transmitted to the fifth amplifier through the third connection node. Each of the first and second frequency converting circuits converts an applied amplifier output to an intermediate frequency signal. The switching circuit is controlled by the power supply control circuit, and selectively switches outputs from the respective fifth amplifiers of the first and second satellite broadcasting receivers and applies the outputs to the first and second frequency converting circuits. The waveguide is integrally formed and shared by the first and second satellite broadcasting receivers.

As described above, outputs from two satellite broadcasting receivers are switched and output to one frequency converting circuit, so that a signal from one of four broadcasting satellites can be selectively applied to the frequency converting circuit. In addition, as the power supply control circuit for two satellite broadcasting receivers is integrally formed, a further reduction in the number of parts can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table showing a relationship of a control signal supplied from a tuner unit and an operation state of the satellite broadcasting receiver;

DESCRIPTION OF THE PREFERRED EMBODIMENTS

Figure 1:
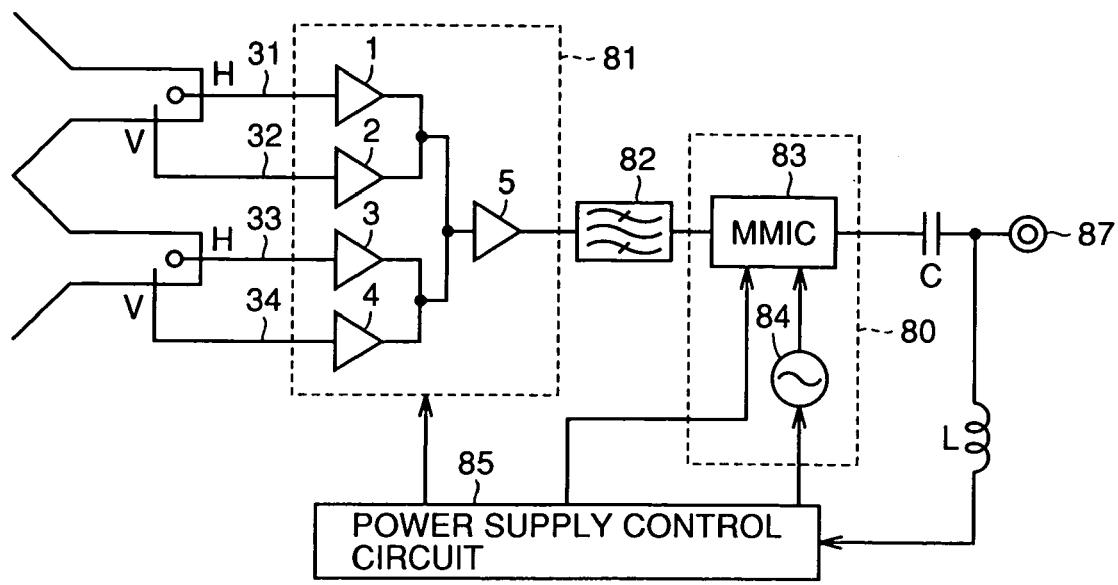
FIG. 1 is a schematic block diagram showing a satellite broadcasting receiver according to an embodiment of the present invention.

Referring to FIG. 1, a satellite broadcasting receiver, i.e., an LNB according to the embodiment of the present invention, will be described.

Figure 13:
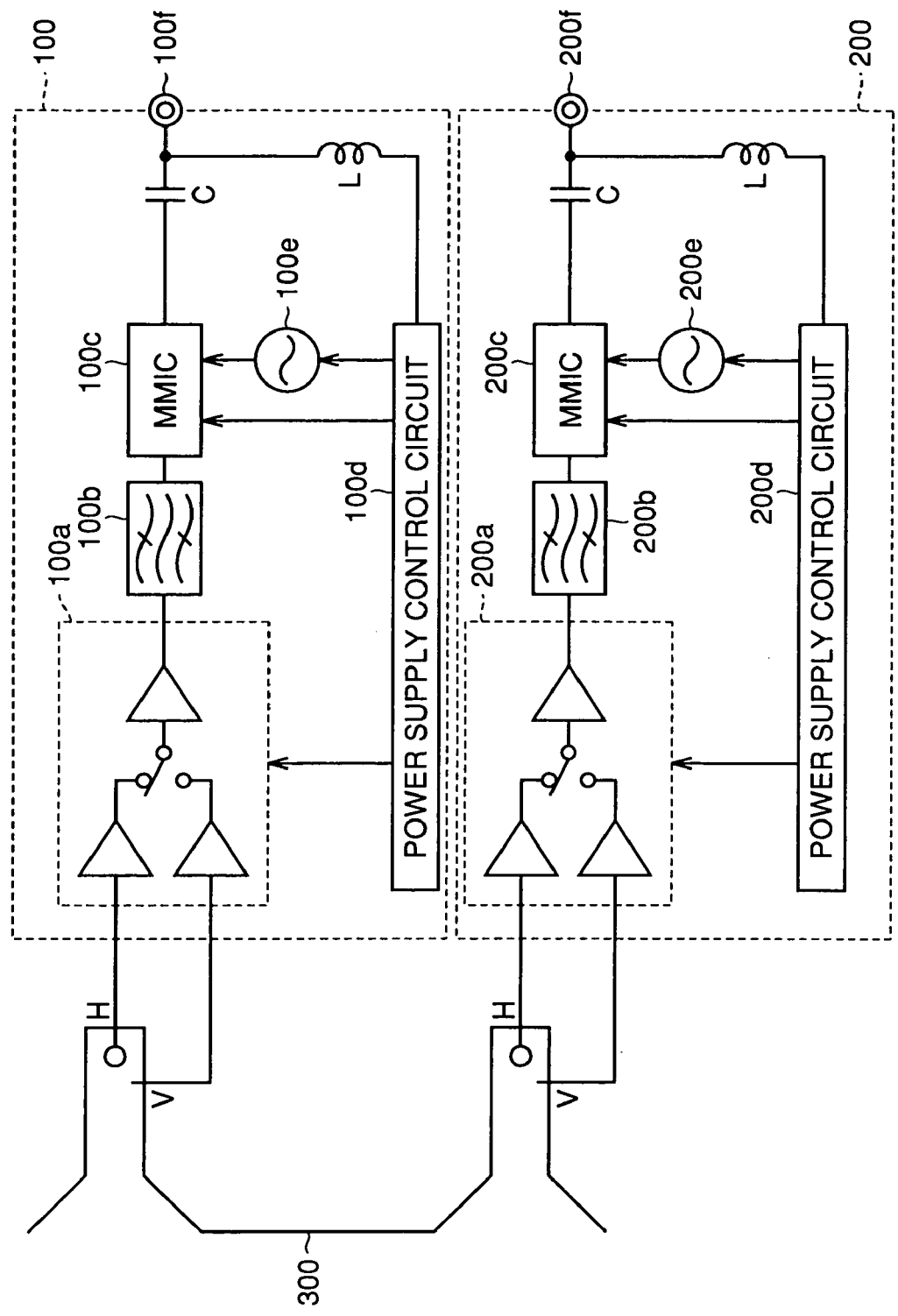
FIG. 13 is a block diagram showing a conventional satellite broadcasting receiving system.

The LNB shown in FIG. 1 basically has a structure similar to that of a conventional LNB 100 or 200 shown in FIG. 13.

More specifically, an output from LNA 81 is applied to a frequency converting circuit 80 (including an MMIC 83 and an oscillator 84) through a BPF82, and converted to an intermediate frequency signal. The resulting intermediate frequency signal is transmitted to a tuner unit (not shown) from a terminal 87 through a capacitor C. Further, a power supply control circuit 85 is supplied with electric power and a control signal through terminal 87 and an inductor L from the tuner unit (not shown).

The LNB shown in FIG. 1 is the same as LNB 100 or 200 in FIG. 13, and therefore the overlapping portion will not be described. However, as will later be described, the structure of LNA 81 shown in FIG. 1 is significantly different from that of LNA 100a or 200a in FIG. 13. In other words, LNA 81 of the LNB in FIG. 1 is structured to receive four different types of signals from two broadcasting satellites. The LNB capable of receiving signal radio waves from two broadcasting satellites is referred to as a dual beam LNB.

More specifically, provided in a waveguide for LNA 81 are: a probe (not shown) detecting a horizontal polarization component H from a signal radio wave from one broadcasting satellite and applying it to an input line 31; a probe (not shown) detecting a vertical polarization component V from the same signal radio wave and applying it to an input line 32; a probe (not shown) detecting a horizontal polarization component H from a signal radio wave received from the other broadcasting satellite and applying it to an input line 33; and a probe (not shown) detecting a vertical polarization component V from the same signal radio wave and applying it to an input line 34.

Figure 2:
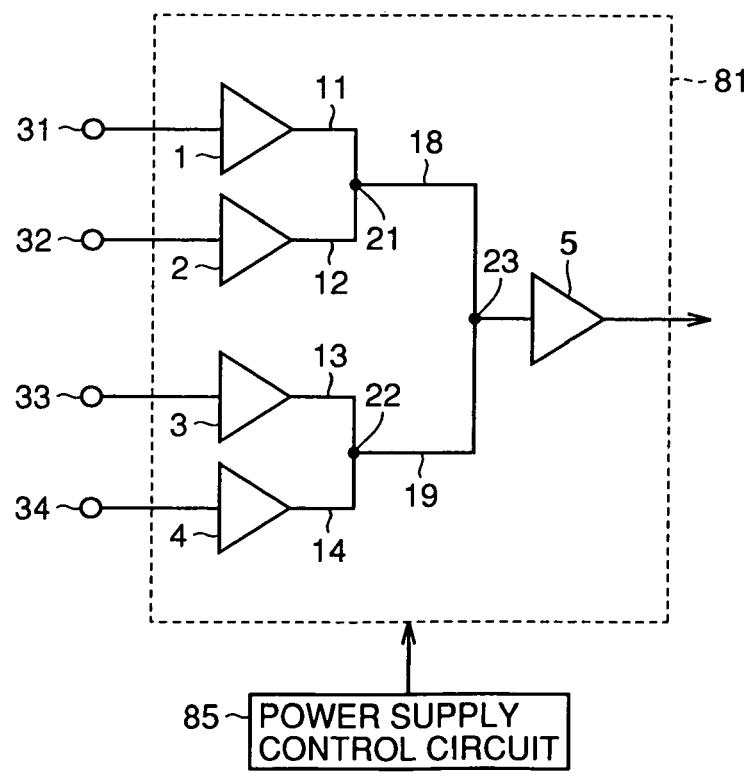
FIG. 2 is a block diagram showing a structure of an LNA of the satellite broadcasting receiver shown in FIG. 1.

FIG. 2 is a block diagram showing LNA 81 in FIG. 1. Referring to FIG. 2, LNA 81 includes: amplifiers 1 to 4 respectively performing low noise amplification on signals from input lines 31 to 34; a connection node 21 supplied with outputs on paths 11 and 12 from amplifiers 1 and 2; a connection node 22 supplied with outputs on paths 13 and 14 from amplifiers 3 and 4; a connection node 23 supplied with outputs on paths 18 and 19 from connection nodes 21 and 22; and an amplifier 5 amplifying an output from connection node 23.

It is noted that each of amplifiers 1 to 5 includes a High Electron Mobility Transistor (HEMT) capable of performing low noise amplification in a frequency band of a microwave. The amplifiers all include HEMTs not just in the case of the embodiment shown in FIGS. 1 and 2 but also in the case of other embodiments which will later be described.

Power supply control circuit 85 controls operations of amplifiers 1 to 4 in accordance with a control signal supplied from a tuner unit (not shown). For example, when only a signal supplied to input line 31 is amplified and introduced to amplifier 5, power supply control circuit 85 sets a bias voltage of the HEMT forming amplifier 1 such that a current flowing through the HEMT is at a prescribed value, and sets bias voltages of HEMTs forming all the other amplifiers 2 to 4 such that currents flowing through these HEMTs are at 0.

Similarly, when only a signal supplied to input line 32 is amplified and introduced to amplifier 5, power supply control circuit 85 sets the bias voltages of the HEMT forming amplifier 2 such that the current flowing through the HEMT is at a prescribed value and sets the bias voltages of the HEMTs forming all the other amplifiers 1, 3 and 4 are at 0. When only a signal supplied to input line 33 or 34 is amplified and introduced to amplifier 5, power supply control circuit 85 similarly controls amplifiers 1 to 4.

Now, referring to FIG. 3, a relationship between a control signal received by power supply control circuit 85 from a tuner unit (not shown) and a controlling manner of each of amplifiers 1 to 4 will be described.

Referring to FIG. 3, a control signal applied from the tuner unit to power supply control circuit 85 is set to provide four types of instructions. The tuner unit switches a voltage supplied to power supply control circuit 85 to high or low. On the other hand, the tuner unit switches between a state of transmitting a pulse and a state of not transmitting a pulse in any of high and low states.

Accordingly, as shown in FIG. 3, the control signal from the tuner unit has four states, i.e., a state of high with pulse transmission, a state of low with pulse transmission, a state of high without pulse transmission, and a state of low without pulse transmission.

According to the relationship shown in FIG. 3, power supply control circuit 85 controls the bias voltages of the HEMTs forming amplifiers 1 to 4 such that the current flowing through amplifier 1 is at a prescribed value and the currents flowing through amplifiers 2 to 4 are at 0 when the control signal has a high voltage with a pulse. As a result, an input signal on input line 31 is transmitted from LNA 81 and converted to an intermediate frequency signal by a frequency converting circuit 80 (FIG. 1) in the subsequent stage.

On the other hand, power supply control circuit 85 controls the bias voltages of the HEMTs of amplifiers 1 to 4 such that the current flowing through amplifier 2 is at a prescribed value and the currents flowing through amplifiers 1, 3 and 4 are at 0 when the control signal has a low voltage with a pulse. As a result, the input signal on input line 32 is transmitted from LNA 81 and converted to an intermediate frequency signal by frequency converting circuit 80 in the subsequent stage.

In addition, power supply control circuit 85 controls the bias voltages of the HEMTs of amplifiers 1 to 4 such that the current flowing through amplifier 3 is at a prescribed value and the currents flowing through amplifiers 1, 2, and 4 are at 0 when the control signal has a high voltage without pulse. As a result, an input signal on input line 33 is transmitted from LNA 81 and converted to the intermediate frequency signal by frequency converting circuit 80 in the subsequent stage.

Further, power supply control circuit 85 controls the bias voltages of the HEMTs of amplifiers 1 to 4 when the current flowing through amplifier 4 is at a prescribed value and the currents flowing through amplifiers 1 to 3 are at 0 when the control signal has a low voltage without pulse. As a result, an input signal on input line 34 is transmitted from LNA 81 and converted to an intermediate frequency signal by frequency converting circuit 80 in the subsequent stage.

In short, power supply control circuit 85 sets the current of one of four amplifiers at a prescribed value and sets the currents flowing through all the other three amplifiers at 0 in accordance with a control signal from a tuner unit, so that one of the input signals on input lines 31 to 34 is selectively amplified and applied to the frequency converting circuit through amplifier 5. It is noted that the HEMT of amplifier 5 is set such that the current always flows therethrough.

In addition, power supply control circuit 85 is structured as an IC block for miniaturization of the LNB.

Now, a method of determining electric lengths of paths 11, 12, 13, 14, 18, and 19 respectively guiding outputs from amplifiers 1, 2, 3, 4, and connection nodes 21, 22 to connection nodes 21, 21, 22, 22, 23, 23 will be described.

Assume that the current flowing through amplifier 1 is set at a prescribed value and the current flowing through amplifier 2 is set at 0. In this state, if it seems as if only path 11 is connected to connection node 21 and path 12 is not connected to connection node 21 when paths 11 and 12 are observed from connection node 21, the output from amplifier 1 is guided to amplifier 5 through connection node 21 and path 18 without any loss.

Here, assume that amplifier 2 is not connected to the end of path 12. In this case, if an electric length of the pattern forming path 12 is set to a length corresponding to $\lambda/4$ in a receiving band (12.2 GHz to 12.75 GHz), reflection waves in phase would be returned when path 12 is observed from connection node 21. Thus, an impedance of path 12, not having its end connected to amplifier 2, becomes infinity and such situation is equivalent to the situation where path 12 per se is not connected to connection node 21.

In the embodiment, however, amplifier 2 is actually connected to the end of path 12. Thus, even if amplifier 2 is in a non-operation state, its output impedance affects path 12, so that the impedance of path 12 when path 12 is observed from connection node 21 changes to an impedance that is shifted from infinity.

On the other hand, when amplifier 2 is in an operation state, the electric length of path 12 must be adjusted to be consistent with the output from amplifier 2. Thus, for the electric length of path 12, a reference electric length corresponding to the above mentioned $\lambda/4$ is adjusted such that the impedance of path 12 when path 12 is observed from connection node 21 during non-operation state of amplifier 2 is close to infinity and such that the reference electric length is consistent with the output from amplifier 2 during operation of amplifier 2. This adjustment is also applied to paths 11 and 18 connected to connection node 21. Further, the electric length of the pattern forming paths 13, 14, and 19 connected to connection node 22 is determined.

Figure 4:
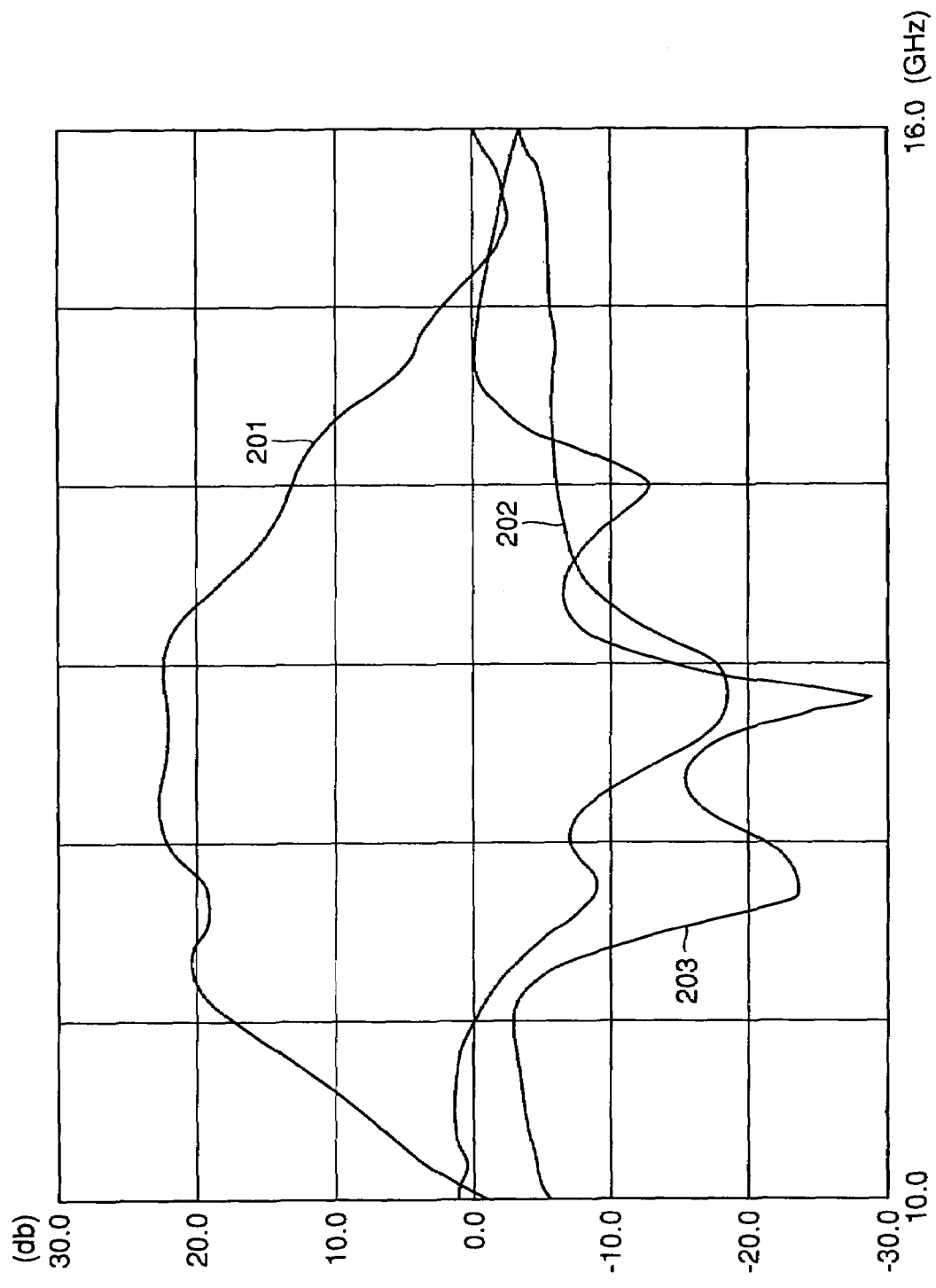
FIG. 4 is a graph showing a characteristic of the LNA shown in FIG. 1.

FIG. 4 is diagram showing a characteristic of LNA 81 (FIG. 2) provided with paths 11 to 14, 18, and 19 formed by the pattern of the electric length determined by the above described method. In FIG. 4, an abscissa and ordinate respectively represent a frequency of a received signal and an amplification factor of the LNA. Referring to FIG. 4, as denoted by a reference numeral 201, a characteristic of an amplification factor exceeding 20 dB is implemented in the receiving band (12.2 GHz to 12.75 GHz) of the satellite broadcasting. On the other hand, as denoted by reference numerals 202 and 203, reflection losses on the input and output sides of LNA 81 are both at values greater than 10 dB. These characteristics satisfy the general requirements for LNA 81.

It is noted that although the LNA in FIG. 2 is exemplified as LNA 81 of the LNB shown in FIG. 1, the structure of LNA 81 is not limited to the structure shown in FIG. 2. The structure in FIG. 2 includes two amplifiers (for example amplifiers 1 and 2) connected to one connection node (for example connection node 21) as the smallest unit in switching the amplifier.

Figure 5:
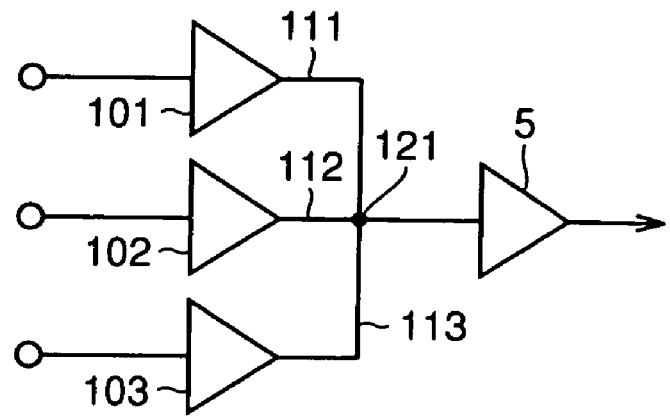
FIG. 5 is a block diagram showing a modification of the LNA according to the embodiment of the present invention.

FIG. 5 shows another exemplary structure of LNA 81. Outputs from three amplifiers 101, 102, and 103 of HEMTs are connected to one connection node 121 respectively through paths 111, 112 and 113. The output from connection node 121 is applied to amplifier 5.

Then, power supply control circuit 85 (FIG. 1) sets a current of one of three amplifiers 101 to 103 at a prescribed value and sets the currents of the other two amplifiers at 0, thereby controlling three amplifiers 101 to 103 such that one of the input signals is selectively amplified and applied to amplifier 5.

Figure 6:
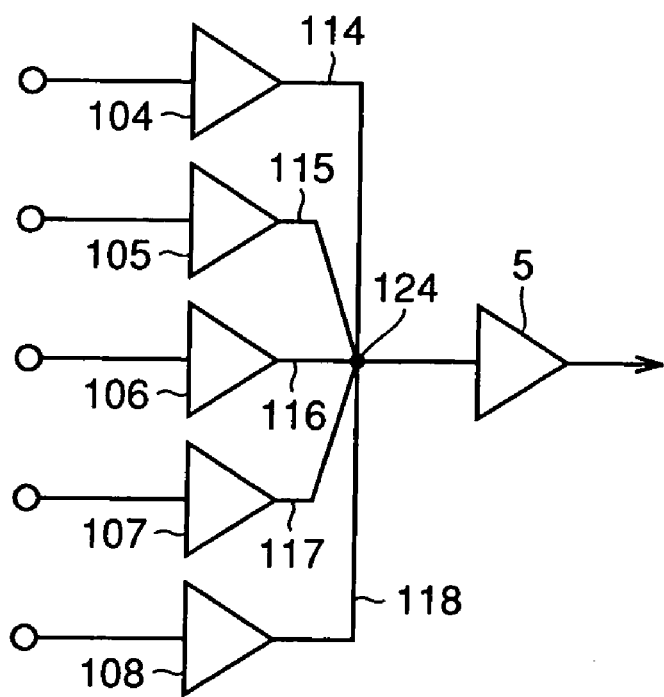
FIG. 6 is a block diagram showing another modification of the LNA according to the embodiment of the present invention.

FIG. 6 shows still another example of LNA 81, where outputs of five amplifiers 104, 105, 106, 107, and 108 of HEMTs are respectively connected to one connection node 124 through paths 114, 115, 116, 117, and 118. An output of connection node 124 is applied to amplifier 5.

Then, power supply control circuit 85 (FIG. 1) sets a current flowing through one of five amplifiers 104 to 108 at a prescribed value and sets the currents flowing through all the four other amplifiers at 0, thereby controlling five amplifiers 104 to 108 such that one of the input signals is selectively amplified and applied to amplifier 5.

Figure 7:
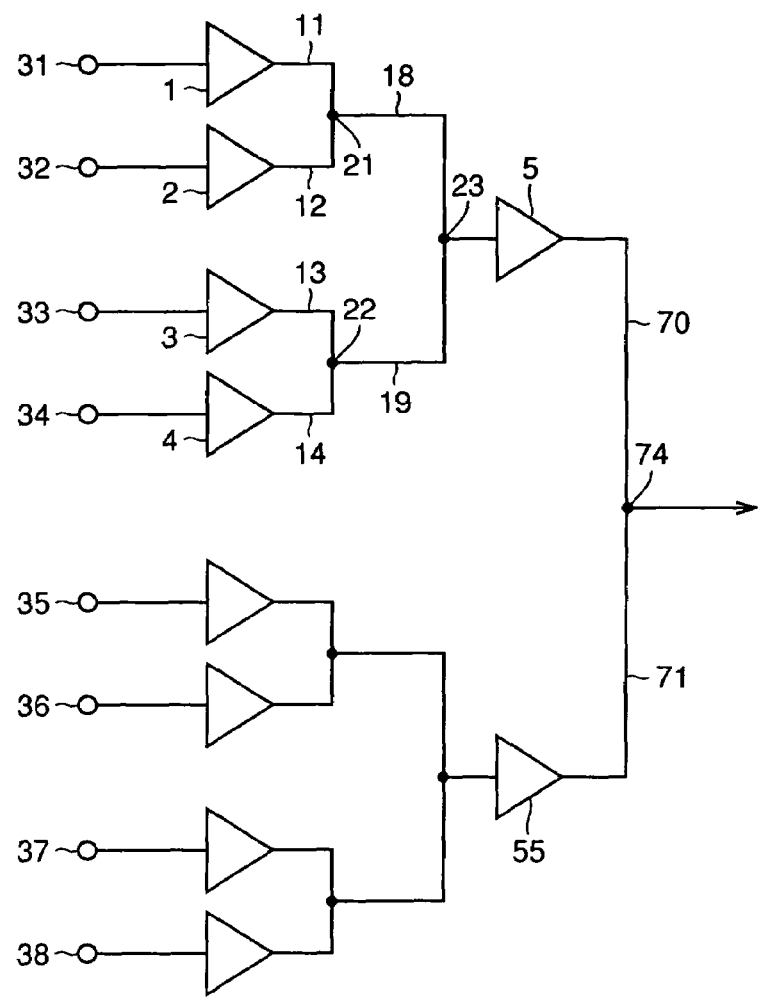
FIG. 7 is a block diagram showing still another modification of the LNA according to the embodiment of present invention.

FIG. 7 shows another exemplary structure of LNA 81, being provided with two sets of structures shown in FIG. 2. An output from amplifier 5 in the first set is guided to connection node 74 through a path 70, and an output from amplifier 55 in the second set is guided to connection node 74 through path 71. Paths 70 and 71 are of the same pattern as that of the above mentioned path 12.

In the structure shown in FIG. 7, when one of the inputs signals to the first set of input lines 31 to 34 is amplified and output to connection node 74, power supply control circuit 85 (FIG. 1) sets a current flowing through amplifier 5 of amplifiers 5 and 55 formed of HEMTs at a prescribed value and sets the current flowing through amplifier 55 at 0. On the other hand, when one of the input signals to the second set of input lines 35 to 38 is amplified and output to connection node 74, the current flowing through amplifier 55 is set at a prescribed value and sets the current flowing through amplifier 5 at 0.

Figure 8:
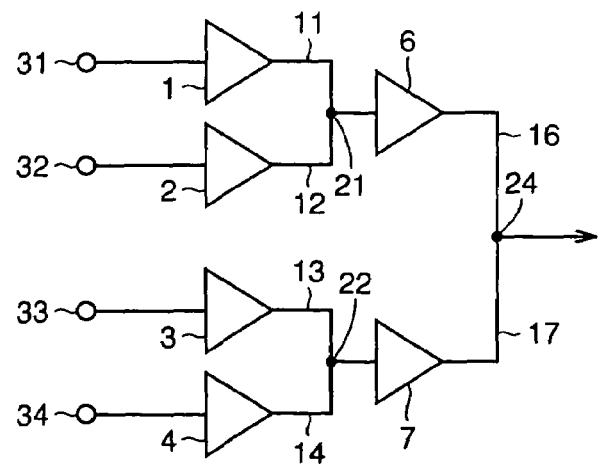
FIG. 8 is a block diagram showing still another modification of the LNA according to the embodiment of the present invention.

FIG. 8 shows still another exemplary structure of LNA 81, which is the same as LNA 81 shown in FIG. 2 except for the following points. More specifically, with reference to FIG. 2, connection nodes 21 and 22 are directly connected to a connection node 23, which is in turn connected to amplifier 5, so that amplification in two stages is implemented. On the other hand, in the structure in FIG. 8, an output of connection node 21 is connected to amplifier 6, and an output of connection node 22 is connected to amplifier 7. Then, outputs of amplifiers 6 and 7 are guided to connection node 24. It is noted that paths 16 and 17 respectively guiding outputs from amplifiers 6 and 7 to connection node 24 are of the same pattern as that of the above mentioned path 12.

When comparing two-stage-amplification structures in FIGS. 2 and 8, it is seen that six amplifiers 1 to 4, 6, and 7 are required for the circuit shown in FIG. 8, but the circuit shown in FIG. 2 includes five amplifiers 1 to 5. Thus, LNA 81 shown in FIG. 2 is advantageous in terms of a manufacturing cost as the number of amplifiers of expensive HEMT elements can be reduced by one.

As described above, in the LNB (FIG. 1) provided with LNA 81 of the circuit structures shown in FIGS. 2, 5, 6, 7, and 8, unlike the conventional art, a switching circuit for switching and outputting outputs from amplifiers is not necessary. Thus, a reduction in the number of parts is achieved. In addition, as the amplifier is selectively brought into an operation state, a current supply to HEMTs can be reduced and a current needs not be supplied to a switching circuit as in the conventional case. Therefore, a significant reduction in power consumption is achieved as a whole. As a result, the power supply of the tuner unit can be reduced in size.

Figure 9:
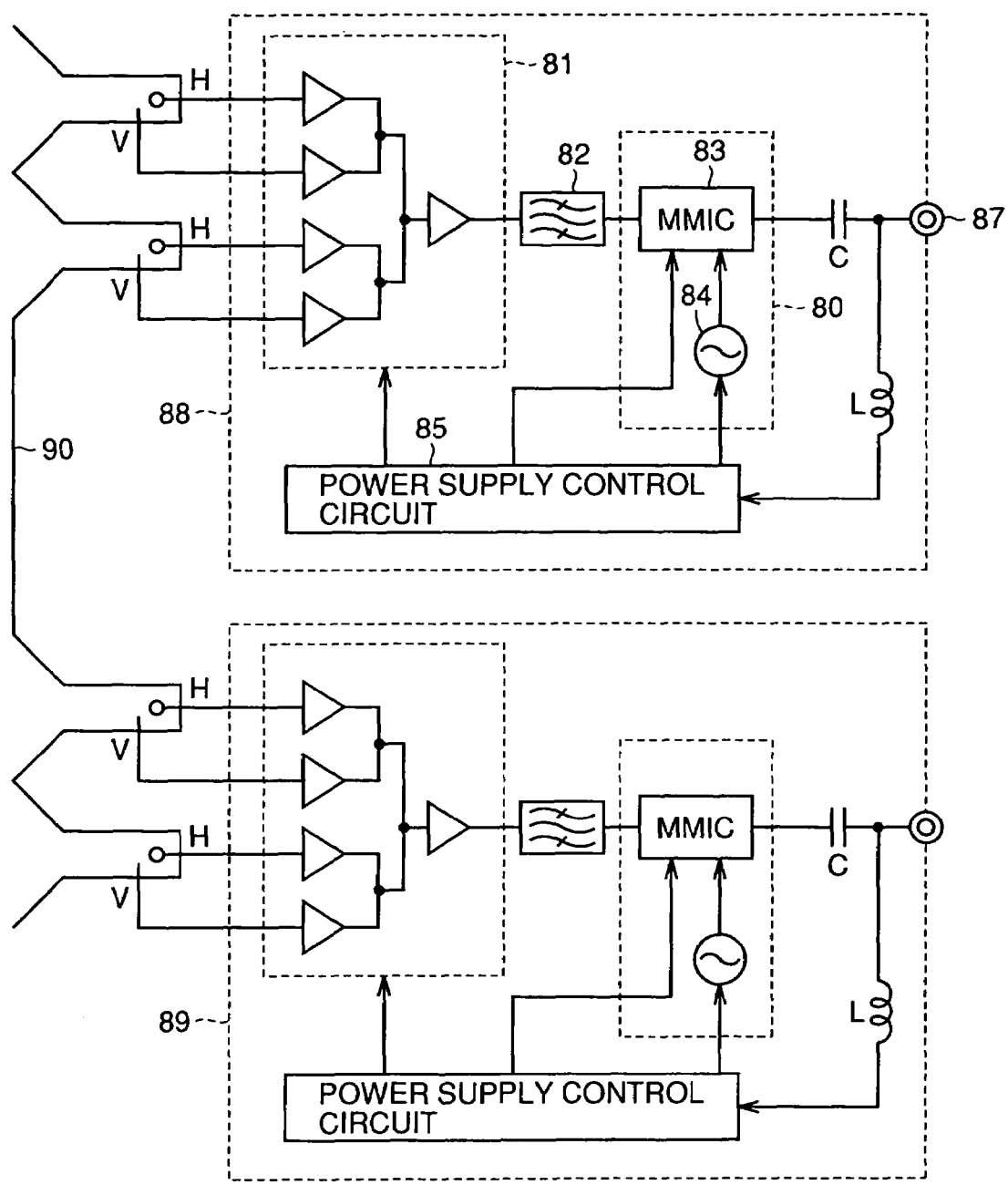
FIG. 9 is a block diagram showing a satellite broadcasting receiving system according to another embodiment of the present invention.

FIG. 9 is a block diagram showing a satellite broadcasting receiving system provided with a wave guide and two dual beam LNBs shown in FIG. 1. Dual beam LNBs 88 and 89 have identical structures. Waveguides for dual beam LNBs 88 and 89 are integrally formed as a single waveguide 90.

In the satellite broadcasting receiving system shown in FIG. 9, dual beam LNBs 88 and 89 can independently operate. Thus, each of dual beam LNBs 88 and 89 can arbitrarily select horizontal or vertical polarization wave transmitted from two broadcasting satellites and convert it to an intermediate frequency signal for transmission to the tuner unit (not shown).

Thus, in the satellite broadcasting receiving system shown in FIG. 9, the waveguide is shared so that the structure is not complicated. In addition, two dual beam LNBs can independently select two broadcasting satellites.

Figure 10:
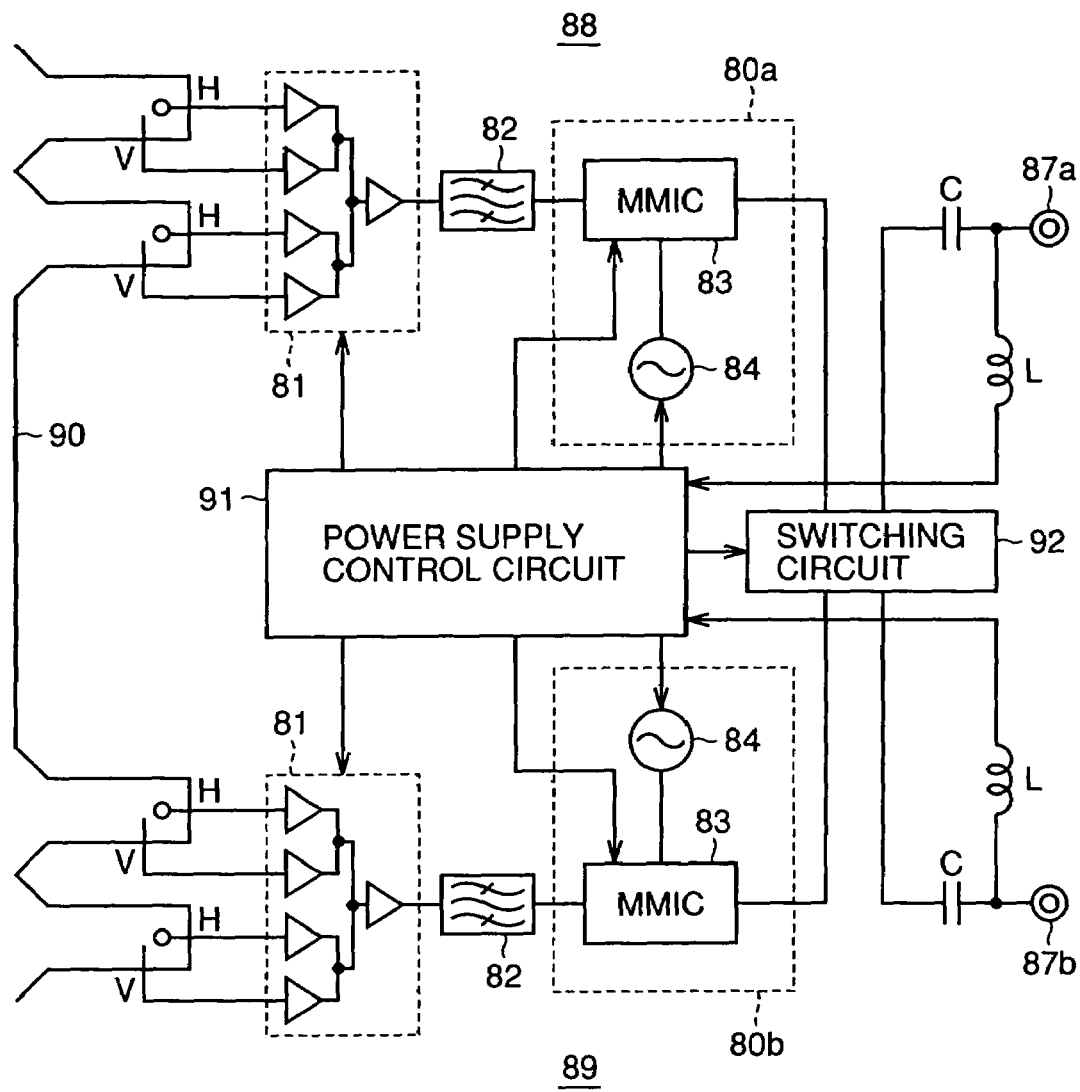
FIG. 10 is a block diagram showing a satellite broadcasting receiving system according to still another embodiment of the present invention.

FIG. 10 is a block diagram showing a satellite broadcasting receiving system provided with a waveguide and two dual beam LNBs basically shown in FIG. 1. The satellite broadcasting receiving system shown in FIG. 10 is different from that shown in FIG. 9 except for the following respects.

In other words, two power supply control circuits 85 for controlling two dual beam LNBs 88 and 89 in FIG. 9 are integrally formed in one circuit block 91 and a switching circuit 92 is added.

If two power supply control circuits 85 are integrally formed in one circuit block, one circuit, which is common to both power supply control circuits, can be shared by the two power supply control circuits. As a result, the number of parts and the size of the power supply control apparatus can be reduced.

Power supply control circuit 91 can receive a control signal from the tuner unit (not shown) through any of terminals 87a and 87b, and controls operations of two dual beam LNBs.

On the other hand, switching circuit 92 is responsive to a control signal from power supply control circuit 91 for selectively switching outputs from frequency converting circuits 80a and 80b of dual beam LNBs 88 and 89 and applying the outputs to output terminals 87a and 87b. More specifically, switching circuit 92 selectively applies the output form frequency converting circuit 80a to one of output terminals 87a and 87b, and applies the output from frequency converting circuit 80b to one of output terminals 87a and 87b to which the output from frequency converting circuit 80a has not been applied.

As described above, a correspondency between frequency converting circuits 80a, 80b and output terminals 87a, 87b can arbitrarily switched, so that a correspondency between (horizontal or vertical polarization) signals from one and the other broadcasting satellites received by dual beam LNBs 88, 89 and two output terminals can arbitrarily be switched.

Figure 11:
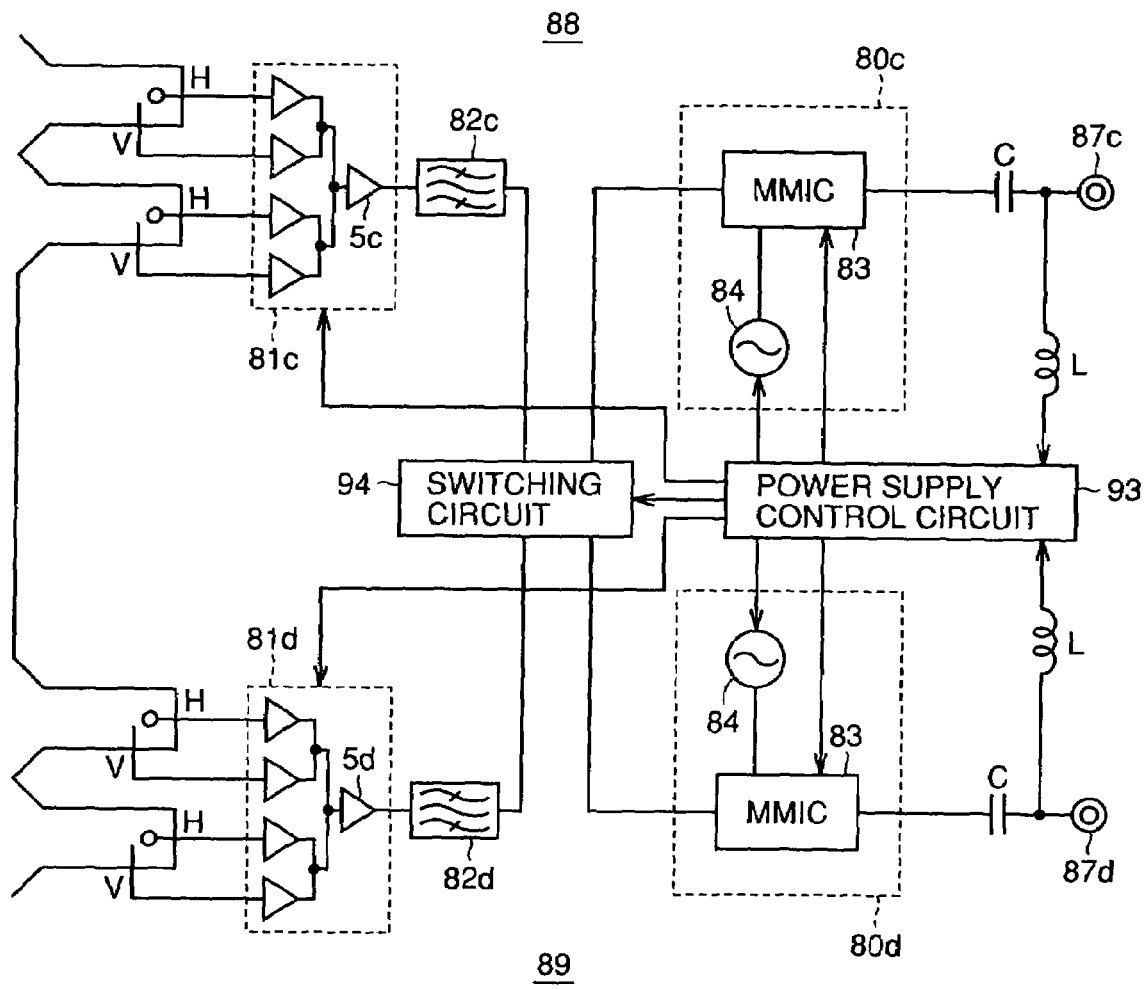
FIG. 11 is a block diagram showing a satellite broadcasting receiving system according to still another embodiment of the present invention.

FIG. 11 is a block diagram showing an embodiment of a satellite broadcasting receiving system provided with a waveguide and two dual beam LNBs basically shown in FIG. 1. The satellite broadcasting receiving system shown in FIG. 11 is different from the satellite broadcasting receiving system shown in FIG. 9 in the following respect.

In other words, the power supply control circuit controlling two LNBs is implemented as one circuit block 93 like the embodiment shown in FIG. 10, and therefore the number of parts has been reduced. Power supply control circuit 93 can receive a control signal from the tuner unit (not shown) through any of terminals 87c and 87d, and control operations of two dual beam LNBs.

In addition, in the satellite broadcasting receiving system shown in FIG. 11, a switching circuit 94 is added. Switching circuit 94 is responsive to a control signal from power supply control circuit 93 for selectively switching outputs from LNAs 81c and 81d, respectively supplied through BPFs 82c and 82d, and applying the outputs to respective inputs of frequency converting circuits 80c and 80d. In other words, switching circuit 94 selectively applies an output from LNA 81c (an output from amplifier 5c) to one of the inputs of frequency converting circuits 80c and 80d, and applies an output from LNA 81d (an output from amplifier 5d) to one of frequency converting circuits 80c and 80d to which the output from LNA 81c has not been applied.

Thus, as the correspondency between LNAs 81c, 81d and frequency converting circuits 80c, 80d can arbitrarily be switched, the correspondency between (horizontal or vertical polarization waves) signals from one and the other broadcasting satellites respectively received by dual beam LNBs 88, 87 and two output terminals 87c, 87d can arbitrarily be switched.

Further, switching circuit 94 is provided in the preceding stage of frequency converting circuits 80c and 80d in the satellite broadcasting receiving system shown in FIG. 11. Thus, as compared with the arrangement of the switching circuit shown in FIG. 10, a space is readily obtained between paths for respectively guiding outputs from frequency converting circuits 80c and 80d to output terminals 87c and 87d. Therefore, a proper isolation is ensured between output terminals 87c and 87d.

Figure 12:
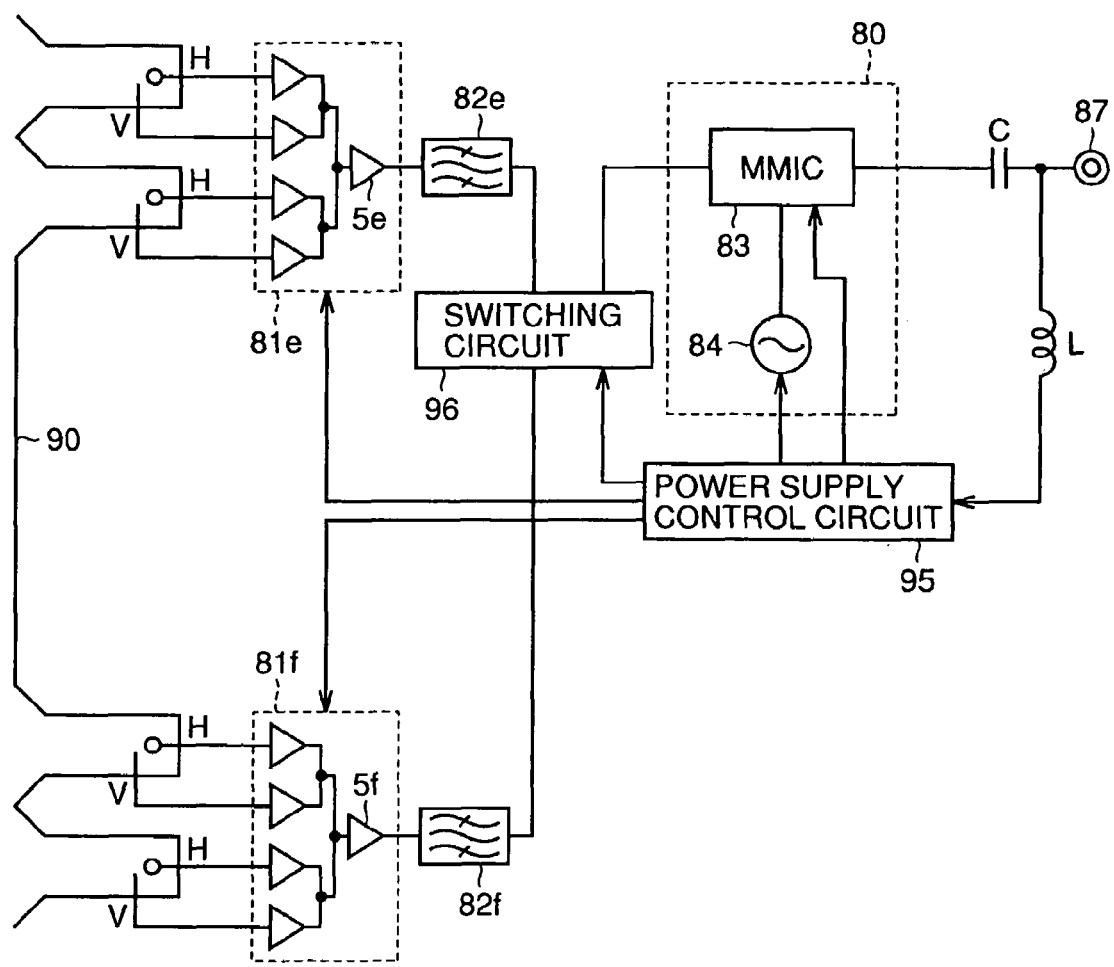
FIG. 12 is a block diagram showing a satellite broadcasting receiving system according to still another embodiment of the present invention.

FIG. 12 is a block diagram showing a satellite broadcasting receiving system provided with a waveguide and two systems of LNAs basically shown in FIG. 2 and one system of the frequency converting circuit in the subsequent stage. In the system shown in FIG. 12, the power supply control circuit for controlling operations of two LNAs 81e and 81f as well as frequency converting circuit 80 is implemented as one circuit block 95, so that a reduction in the number of parts and the size of the power supply control circuit is achieved.

Switching circuit 96 is responsive to a control signal from power supply control circuit 95 for selectively switching outputs from LNAs 81e and 81f (outputs from amplifiers 5e and 5f) respectively supplied through BPFs 82e and 82f and applying the output to the input of frequency converting circuit 80.

As in the forgoing, the correspondency between outputs from LNA 81e, 81f, and the input of frequency converting circuit 80 can arbitrarily be switched, so that an arbitrary one of (horizontal and vertical polarization waves) signals from two satellites, respectively guided to amplifiers 5e and 5f of LNAs 81e and 81f, is guided to frequency converting circuit 80. More specifically, a signal from an arbitrary one of the four broadcasting satellites can be received by a satellite broadcasting receiving system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A satellite broadcasting receiver receiving signal radio waves from respective broadcasting satellites, comprising:

first to nth (where n is an integer equal to or larger than 2) amplifiers respectively amplifying first to nth signals extracted from said signal radio waves from the respective broadcasting satellites;

a connection node supplied with outputs from said first to nth amplifiers; and a power supply control circuit controlling said first to nth amplifiers to set a current flowing through one of said first to nth amplifiers at a prescribed value and set currents flowing through all the other amplifiers at 0 such that an output from said one amplifier is transmitted through said connection node.

2. The satellite broadcasting receiver according to claim 1, further comprising a (n+1)th amplifier for amplifying an output transmitted from said connection node.

3. The satellite broadcasting receiver according to claim 2, wherein each of said first to (n+1)th amplifiers includes a high electron mobility transistor.

4. The satellite broadcasting receiver according to claim 2, further comprising a frequency converting circuit converting an output from said (n+1)th amplifier to an intermediate frequency signal.

5. A satellite broadcasting receiver receiving signal radio waves from broadcasting satellites, comprising:

first to fourth amplifiers respectively amplifying first to fourth signals extracted from said signal radio waves;

a first connection node supplied with outputs from said first and second amplifiers;

a second connection node supplied with outputs from said third and fourth amplifiers;

a third connection node supplied with outputs from said first and second connection nodes;

a fifth amplifier amplifying an output transmitted from said third connection node;

a power supply control circuit controlling said first to fourth amplifiers to set a current flowing through one of said first to fourth amplifiers at a prescribed value and set currents flowing through all the other amplifiers at 0 such that an output from said one amplifier is transmitted to said fifth amplifier through said third connection node.

6. The satellite broadcasting receiver according to claim 5, wherein each of said first to fifth amplifiers includes a high electron mobility transistor.

7. The satellite broadcasting receiver according to claim 5, further comprising a frequency converting circuit converting an output from said fifth amplifier to an intermediate frequency signal.

8. The satellite broadcasting receiver according to claim 5, further comprising:

sixth to ninth amplifiers respectively amplifying fifth to eighth signals extracted from said signal radio waves;

a fourth connection node supplied with outputs from said sixth and seventh amplifiers;

a fifth connection node supplied with outputs from said eighth and ninth amplifiers;

a sixth connection node supplied with outputs from said fourth and fifth connection node;

a tenth amplifier amplifying an output transmitted from said sixth connection node; and a seventh connection node supplied with outputs from said fifth and tenth amplifiers, wherein said power supply control circuit controls said sixth to ninth amplifiers to set a current flowing through one of said sixth to ninth amplifiers at a prescribed value and set currents flowing through all the other amplifiers at 0 such that an output from said one amplifier is transmitted to said tenth amplifier through said sixth connection node, and controls said fifth and tenth amplifiers to set currents flowing through said fifth and tenth amplifiers respectively at a prescribed value and 0 such that an output from said fifth amplifier is transmitted through said seventh connection node and set currents flowing through said fifth and tenth amplifiers respectively at 0 and a prescribed value such that an output from said tenth amplifier is transmitted through said seventh connection node.

9. The satellite broadcasting receiver according to claim 8, wherein each of said sixth to tenth amplifiers includes a high electron mobility transistor.

10. The satellite broadcasting receiver according to claim 8, further comprising a frequency converting circuit converting an output from said seventh connection node to an intermediate frequency signal.

11. A satellite broadcasting receiver receiving signal radio waves from broadcasting satellites, comprising:

first to fourth amplifiers respectively amplifying first to fourth signals extracted from said signal radio waves;

a first connection node supplied with outputs from said first and second amplifiers;

a second connection node supplied with outputs from said third and fourth amplifiers;

a fifth amplifier amplifying an output transmitted from said first connection node;

a sixth amplifier amplifying an output transmitted from said second connection node;

a third connection node supplied with outputs from said fifth and sixth amplifiers; and a power supply control circuit controlling said first to fourth amplifiers to set a current flowing through one of said first to fourth amplifiers at a prescribed value and set currents flowing through all the other amplifiers at 0 such that an output from said one amplifier is transmitted to said fifth or sixth amplifier through said first or second connection node, and controlling said fifth and sixth amplifiers to set currents flowing through said fifth and sixth amplifiers respectively at a prescribed value and 0 such that an output from said fifth amplifier is transmitted through said third connection node and set currents flowing through said fifth and sixth amplifiers respectively at 0 and a prescribed value such that an output from said sixth amplifier is transmitted through said third connection node.

12. The satellite broadcasting receiver according to claim 11, wherein each of said first to sixth amplifiers includes a high electron mobility transistor.

13. The satellite broadcasting receiver according to claim 11, further comprising a frequency converting circuit converting an output from said third connection node to an intermediate frequency signal.

14. A satellite broadcasting receiving system receiving signal radio waves from broadcasting satellites, comprising first and second satellite broadcasting receivers, each including first to fourth amplifiers respectively amplifying first to fourth signals extracted from said signal radio waves, a first connection node supplied with outputs from said first and second amplifiers, a second connection node supplied with outputs from said third and fourth amplifiers, a third connection node supplied with outputs from said first and second connection nodes, a fifth amplifier amplifying an output transmitted from said third connection node, a power supply control circuit controlling said first to fourth amplifiers to set a current flowing through one of said first to fourth amplifiers at a prescribed value and set currents flowing through all the other amplifiers at 0 such that an output from said one amplifier is transmitted to said fifth amplifier through said third connection node, and a frequency converting circuit converting an output from said fifth amplifier to an intermediate frequency signal, said system further comprising an integrally formed waveguide shared by said first and second satellite broadcasting receivers.

15. A satellite broadcasting receiving system receiving signal radio waves from broadcasting satellites, comprising first and second satellite broadcasting receivers, each including first to fourth amplifiers respectively amplifying first to fourth signals extracted from said signal radio waves, a first connection node supplied with outputs from said first and second amplifiers, a second connection node supplied with outputs from said third and fourth amplifiers, a third connection node supplied with outputs from said first and second connection nodes, a fifth amplifier amplifying an output transmitted from said third connection node, and a frequency converting circuit converting an output from said fifth amplifier to an intermediate frequency signal, said system further comprising a power supply control circuit controlling said first to fourth amplifiers to set a current flowing through one of said first to fourth amplifiers at a prescribed value and set currents flowing through all the other amplifiers at 0 such that an output from said one amplifier is transmitted to said fifth amplifier through said third connection node, first and second output terminals, a switching circuit controlled by said power supply control circuit for selectively switching outputs from said frequency converting circuits of said first and second satellite broadcasting receivers and applying said outputs to said first and second output terminals, and an integrally formed waveguide shared by said first and second satellite broadcasting receivers.

16. The satellite broadcasting receiving system according to claim 15, wherein each of said first to fifth amplifiers in each of said first and second satellite broadcasting receivers includes a high electron mobility transistor.

17. A satellite broadcasting receiving system receiving signal radio waves from broadcasting satellites, comprising first and second satellite broadcasting receivers, each including first to fourth amplifiers respectively amplifying first to fourth signals extracted from said signal radio waves, a first connection node supplied with outputs from said first and second amplifiers, a second connection node supplied with outputs from said third and fourth amplifiers, a third connection node supplied with outputs from said first and second connection nodes, and a fifth amplifier amplifying an output transmitted from said third connection node, said system further comprising a power supply control circuit controlling said first to fourth amplifiers to set a current flowing through one of said first to fourth amplifiers at a prescribed value and set currents flowing through all the other amplifiers at 0 such that an output from said one amplifier is transmitted to said fifth amplifier through said third connection node, first and second frequency converting circuits each converting an applied amplifier output to an intermediate frequency signal, a switching circuit controlled by said power supply control circuit for selectively switching outputs from respective said fifth amplifiers of said first and second satellite broadcasting receivers and applying the outputs to said first and second frequency converting circuits, and an integrally formed waveguide shared by said first and second satellite broadcasting receivers.

18. The satellite broadcasting receiving system according to claim 17, wherein each of said first to fifth amplifiers in each of said first and second satellite broadcasting receivers includes a high electron mobility transistor.

19. A satellite broadcasting receiving system receiving signal radio waves from broadcasting satellites, comprising first and second satellite broadcasting receivers, each including first to fourth amplifiers respectively amplifying first to fourth signals extracted from said signal radio waves, a first connection node supplied with outputs from said first and second amplifiers, a second connection node supplied with outputs from said third and fourth amplifiers, a third connection node supplied with outputs from said first and second connection nodes, and a fifth amplifier amplifying an output transmitted from said third connection node, said system further comprising a power supply control circuit controlling said first to fourth amplifiers to set a current flowing through one of said first to fourth amplifiers at a prescribed value and setting currents flowing all the other amplifiers at 0 such that an output from said one amplifier is transmitted to said fifth amplifier through said third connection node, a frequency converting circuit converting an applied amplifier output to an intermediate frequency signal, a switching circuit controlled by said power supply control circuit for selectively switching an output from said fifth amplifier of said first or second satellite broadcasting receiver and applying it to said frequency converting circuit, and an integrally formed waveguide shared by said first and second satellite broadcasting receivers.

20. The satellite broadcasting receiving system according to claim 19, wherein each of said first to fifth amplifiers in each of said first and second satellite broadcasting receivers includes a high electron mobility transistor.

21. A satellite broadcasting receiver receiving signal radio waves from respective broadcasting satellites, comprising:

first to nth (where n is an integer equal to or larger than 2) amplifiers respectively amplifying first to nth signals extracted from said signal radio waves, the first to nth signals comprising different components of said signal radio waves;

a connection node supplied with outputs from said first to nth amplifiers; and a power supply control circuit controlling said first to nth amplifiers to set a current flowing through one of said first to nth amplifiers at a prescribed value and set currents flowing through all the other amplifiers at 0 such that an output from said one amplifier is transmitted through said connection node.

22. The satellite broadcasting receiver according to claim 21, wherein one of the first to nth signals comprises a horizontal polarization component of the signal radio wave and another of the first to nth signals comprises a vertical polarization component of the signal radio wave.

23. The satellite broadcasting receiver according to claim 21, further comprising a (n+1)th amplifier for amplifying an output transmitted from said connection node.

24. The satellite broadcasting receiver according to claim 23, wherein each of said first to (n+1)th amplifiers includes a high electron mobility transistor.

25. The satellite broadcasting receiver according to claim 23, further comprising a frequency converting circuit converting an output from said (n+1)th amplifier to an intermediate frequency signal.

26. A satellite broadcasting receiver receiving signal radio waves from respective broadcasting satellites, comprising:
   first to nth (where n is an integer equal to or larger than 2) amplifiers respectively amplifying first to nth signals extracted from said signal radio waves;
   a connection node supplied with outputs from said first to nth amplifiers; and
   a power supply control circuit controlling said first to nth amplifiers to set a current flowing through one of said first to nth amplifiers at a prescribed value and set currents flowing through all the other amplifiers at 0 such that an output from said one amplifier is transmitted through said connection node;
   wherein the first to nth signals are provided to the first to nth amplifiers through respective first to nth signal input lines, the first to nth signal input lines not being connected to a common connection node.

27. The satellite broadcasting receiver according to claim 26, further comprising a (n+1)th amplifier for amplifying an output transmitted from said connection node.

28. The satellite broadcasting receiver according to claim 27, wherein each of said first to (n+1)th amplifiers includes a high electron mobility transistor.

29. The satellite broadcasting receiver according to claim 27, further comprising a frequency converting circuit converting an output from said (n+1)th amplifier to an intermediate frequency signal.

* * * * *